United States Patent
Noro

(10) Patent No.: US 6,912,175 B2
(45) Date of Patent: Jun. 28, 2005

(54) SEMICONDUCTOR MEMORY AND METHOD OF CONTROLLING THE SAME

(75) Inventor: Kouichi Noro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/636,708

(22) Filed: Aug. 8, 2003

(65) Prior Publication Data

US 2004/0042254 A1 Mar. 4, 2004

(30) Foreign Application Priority Data

Aug. 28, 2002 (JP) ........................................ 2002-249239

(51) Int. Cl.$^7$ .............................................. G11C 8/00
(52) U.S. Cl. ............................. 365/230.06; 365/185.23; 365/145
(58) Field of Search ................................. 365/145, 149, 365/189.01, 189.09, 189.11, 185.23, 230.06, 117

(56) References Cited

U.S. PATENT DOCUMENTS

| | | | | |
|---|---|---|---|---|
| 5,487,029 A | * | 1/1996 | Kuroda | 365/145 |
| 5,487,032 A | * | 1/1996 | Mihara et al. | 365/145 |
| 6,301,145 B1 | * | 10/2001 | Nishihara | 365/145 |
| 6,785,155 B2 | * | 8/2004 | Matsushita | 365/145 |
| 6,788,564 B2 | * | 9/2004 | Hamada | 365/145 |

FOREIGN PATENT DOCUMENTS

JP        09116107 A        5/1997

* cited by examiner

*Primary Examiner*—Gene N. Auduong
(74) *Attorney, Agent, or Firm*—Arent Fox PLLC

(57) ABSTRACT

Each of a plurality of memory cells includes one ferroelectric capacitor having one terminal connected to a bit line. A plurality of decoder circuits are arranged on each of the plurality of memory cells, and connected to the other terminal of the ferroelectric capacitor forming the memory cells via a plurality of word lines. These plurality of decoder circuits control the word lines to one of high level, low level, and a floating state, thereby writing data in the memory cells or reading out data from the memory cells.

10 Claims, 4 Drawing Sheets

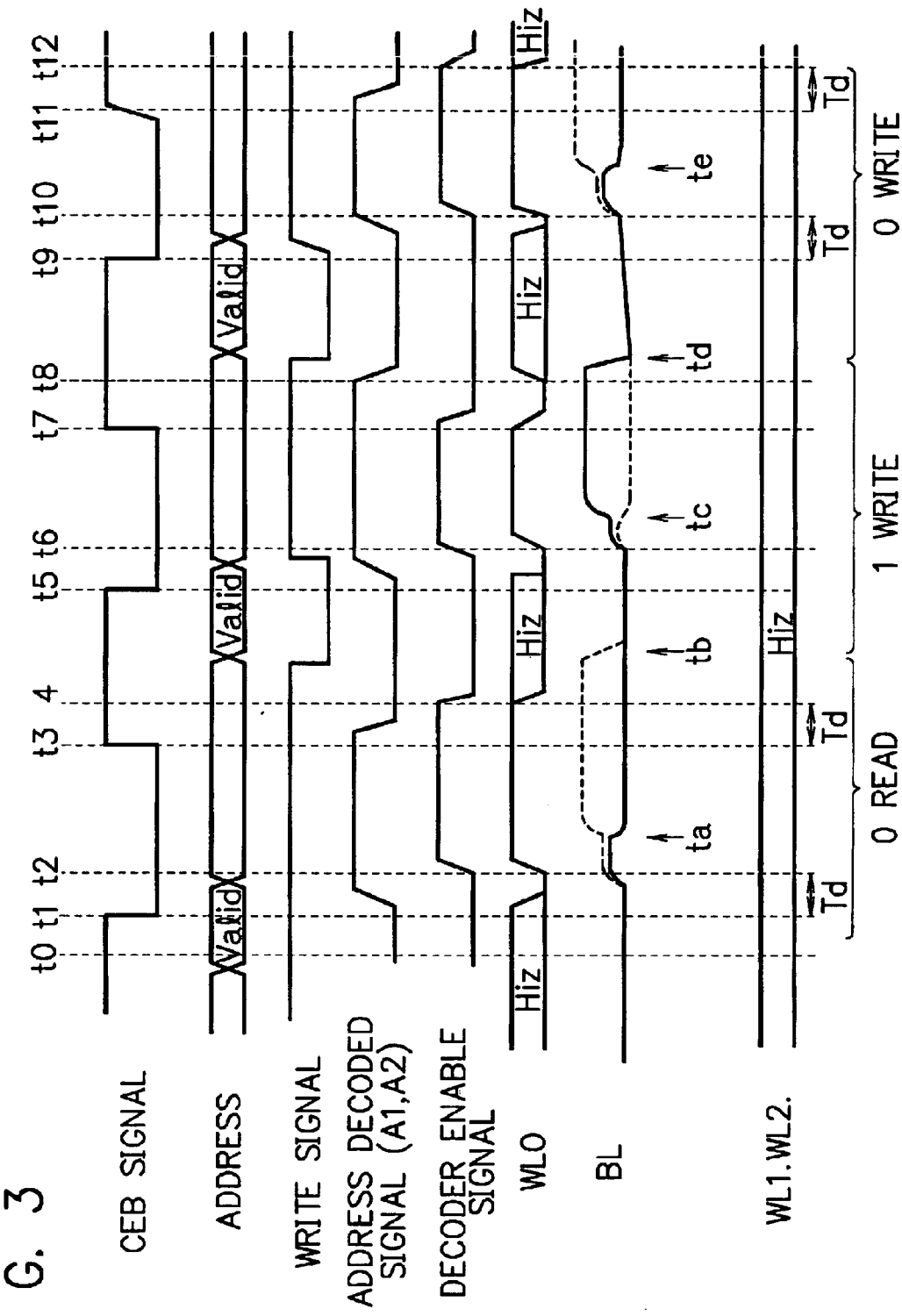

SEMICONDUCTOR MEMORY AND METHOD OF CONTROLLING THE SAME

CROSS-REFERENCE TO RELATED APPLICATIONS

This application is based upon and claims the benefit of priority from the prior Japanese Patent Application No. 2002-249239, filed on Aug. 28, 2002, the entire contents of which are incorporated herein by reference.

BACKGROUND OF THE INVENTION

1. Field of the Invention

The present invention relates to a semiconductor memory having a memory cell including a ferroelectric capacitor, and a method of controlling the semiconductor memory.

2. Description of the Related Art

Conventionally, a ferroelectric memory (semiconductor memory) which has a memory cell including a ferroelectric capacitor and stores data in accordance with the polarization direction of the ferroelectric capacitor is known. Known memory cells of this ferroelectric memory are 2T2C in which one memory cell is made up of two selection transistors and two ferroelectric capacitors, and 1T1C in which one memory cell is made up of one selection transistor and one ferroelectric capacitor.

FIG. 4 is a view showing an outline of the arrangement of a conventional 1T1C memory cell including a ferroelectric capacitor. As shown in FIG. 4, this memory cell M includes one ferroelectric capacitor C and one transistor Tr. One terminal of the ferroelectric capacitor C is connected to a bit line BL via the transistor Tr. The other terminal of this ferroelectric capacitor C is connected to a plate line PL. The bit line BL is connected to a sense amplifier 70. This bit line BL is precharged or its potential difference is amplified by activation by the sense amplifier 70. The gate terminal of the transistor Tr is connected to a word line WL, and the transistor Tr is turned on and off by controlling the signal level of this word line WL. A boosting circuit 71 is connected to the word line WL and boosts this word line WL. A plate line driver 72 is connected to the plate line PL and applies an arbitrary voltage to this plate line PL.

Referring to FIG. 4, the transistor Tr functions as a switching element for separating the bit line BL and ferroelectric capacitor C. For example, to read out data from this memory cell M, the transistor Tr is turned on to open its switching gate to connect one terminal of the ferroelectric capacitor C to the bit line BL. Then, the plate line driver 72 applies a predetermined voltage to the plate line PL, thereby applying this predetermined voltage to the other terminal of the ferroelectric capacitor C. In this manner, electric charge is output from the ferroelectric capacitor C to the bit line BL, thereby reading out the data.

To write "1" data in the memory cell M, the transistor Tr is turned on to apply a power supply voltage, which is precharged to the bit line BL, to one terminal of the ferroelectric capacitor C connected to this bit line BL. The plate line driver 72 applies 0 V to the plate line PL. Accordingly, the "1" data is written in the memory cell M. In this case, to reduce the ON resistance of the transistor Tr, the applied voltage to the gate terminal of this transistor Tr must be boosted to a voltage value (e.g., 6 to 7 V if the power supply voltage is 5 V) larger than the value of the power supply voltage above. That is, the boosting circuit 71 boosts the value of the voltage to be applied to the word line WL so that this voltage value is larger than that of the power supply voltage precharged to the bit line BL. Consequently, the ON resistance of the transistor Tr can be reduced, and a voltage close to the power supply voltage can be applied to one terminal (on the side of the bit line BL) of the ferroelectric capacitor C. This allows the ferroelectric capacitor C to be reliably polarized.

Unfortunately, the above-mentioned boosting circuit requires a peripheral circuit for controlling the boosting timing, and this complicates the circuit configuration.

Also, it is increasingly demanded to further simplify the circuit configuration by omitting the plate line driver for applying a voltage to the plate line as described above.

SUMMARY OF THE INVENTION

The present invention has been made in consideration of the above situation, and has as its object to provide a semiconductor memory requiring no word line boosting circuit, and a method of controlling the semiconductor memory.

It is another object of the present invention to provide a semiconductor memory whose circuit configuration is simplified by omitting a plate line driver for applying a voltage to a plate line, and a method of controlling the semiconductor memory.

The present invention has been made to achieve the above objects. A semiconductor memory and a method of controlling the same according to the present invention are characterized by comprising a plurality of memory cells each including one ferroelectric capacitor having one terminal connected to a bit line and the other terminal connected to a word line, and a plurality of decoders arranged on each of the plurality of memory cells and connected to the memory cell via the word line, wherein the plurality of decoders control the word line to one of high level, low level, and a floating state.

As described above, the semiconductor memory and the method of controlling the same according to the present invention eliminate a transistor which is conventionally formed between a bit line and memory cell (ferroelectric capacitor), and directly connect the bit line and memory cell. This obviates the need to form any boosting circuit for boosting a word line when data is to be written in a memory cell. Furthermore, a word line is connected to that terminal of a memory cell, which is conventionally connected to a plate line, and address selection and voltage application are performed from this word line. Consequently, a simple circuit configuration can be obtained by omitting a plate line driver for applying a voltage to a plate line.

BRIEF DESCRIPTION OF THE DRAWINGS

FIG. 3 is a timing chart showing the operation of a ferroelectric semiconductor device including the memory cell peripheral circuits shown in FIG. 1.

DETAILED DESCRIPTION OF THE PREFERRED EMBODIMENTS

An embodiment of the present invention will be described below.

First, the arrangement of memory cell peripheral circuits of a ferroelectric memory (semiconductor memory) as an embodiment of the present invention will be explained with reference to the accompanying drawing.

Figure 1:
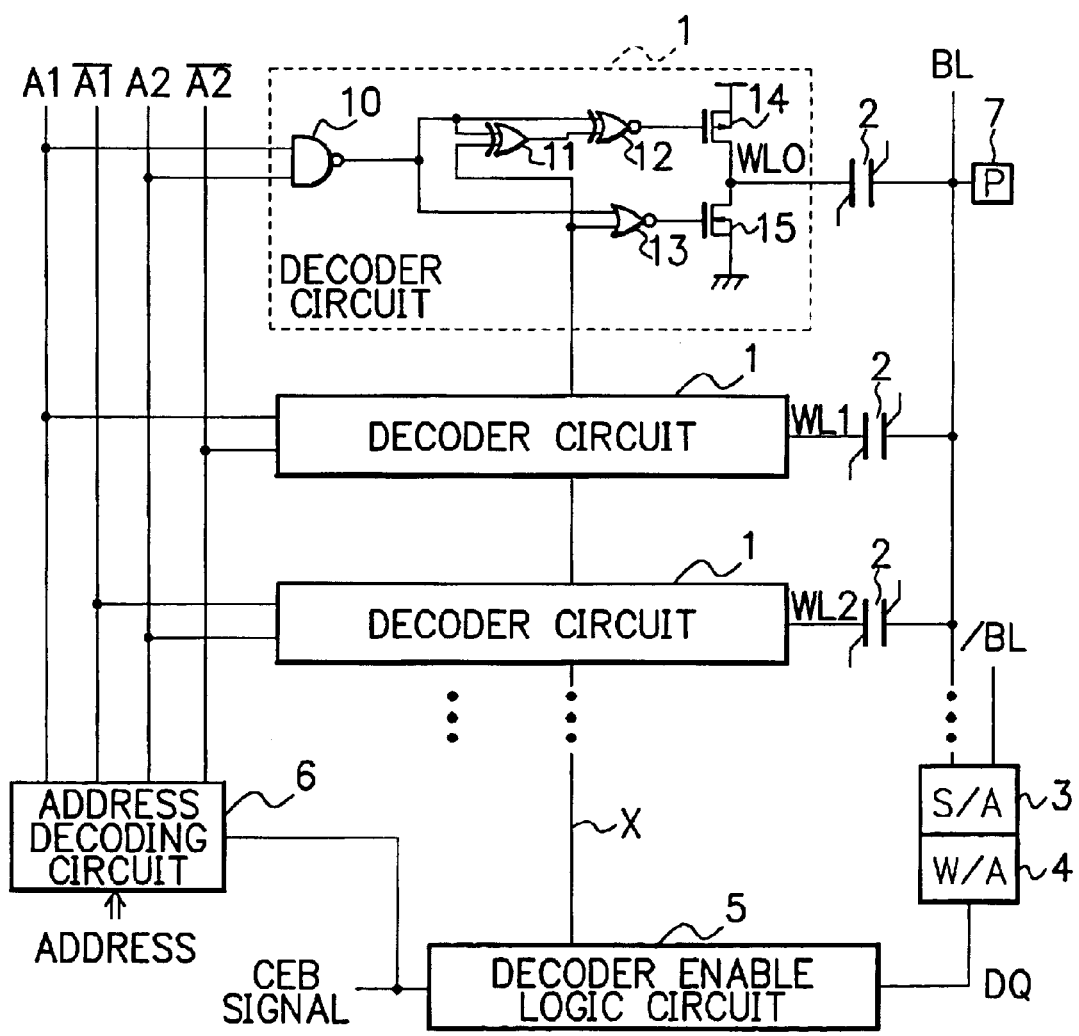
FIG. 1 is a block diagram showing the arrangement of memory cell peripheral circuits of a ferroelectric memory as an embodiment of the present invention.

FIG. 1 is a block diagram showing the arrangement of the memory cell peripheral circuits of the ferroelectric memory as an embodiment of the present invention. Note that the configuration of this ferroelectric memory is the same as a conventional ferroelectric memory except for the memory cell peripheral circuits.

In FIG. 1, reference numeral 1 denotes a decoder circuit which selects a word line WL (to be described later) on the basis of address decoded signals (A1, /A1, A2, and /A2) obtained by decoding an address by an address decoding circuit 6 (to be described later). This decoder circuit 1 also receives a decoder enable signal X (to be described later) for controlling whether to activate the decoder circuit 1. The decoder circuit 1 is arranged on each of word lines WL0, WL1, WL2, . . . (to be referred to as word lines WL hereinafter). That is, the output terminals of these decoder circuits 1 are connected in one-to-one correspondence with the word lines WL. Each decoder circuit 1 includes a NAND gate 10, ExOR (Exclusive OR) gate 11, ExNOR (Exclusive NOR) gate 12, NOR gate 13, p-type MOSFET (Metal Oxide Semiconductor Field Effect Transistor) 14, and n-type MOSFET 15. The ExNOR gate is a circuit which operates in the same manner as when an inverter is attached to the output of the ExOR gate.

The two input terminals of the NAND gate 10 are connected to signal lines of address decoded signals. More specifically, these input terminals are connected to signal lines for supplying the address decoded signals A1 and A2. Of the address decoded signals A1, /A1, A2, and /A2, /A1 and /A2 are inverted signals of A1 and A2, respectively. An address for selecting a word line WL is determined in accordance with signal lines of address decoded signals to which the two input terminals of the NAND gate 10 are connected.

The output terminal of this NAND gate 10 is connected to one input terminal of each of the ExOR gate 11, ExNOR gate 12, and NOR gate 13. The other input terminals of the ExOR gate 11 and NOR gate 13 are connected to a signal line of the decoder enable signal X for controlling the decoder circuit 1. The output terminal of the ExOR gate 11 is connected to the other input terminal of the ExNOR gate 12. The output terminal of this ExNOR gate 12 is connected to the gate terminal of the p-type MOSFET 14. The output terminal of the NOR gate 13 is connected to the gate terminal of the n-type MOSFET 15.

Also, the drain terminals of the p-type MOSFET 14 and n-type MOSFET 15 are interconnected, and the word line WL is connected to this interconnecting point. The source terminal of the p-type MOSFET 14 is connected to a power supply voltage. The source terminal of the n-type MOSFET 15 is grounded. In the above configuration, the decoder circuit 1 controls ON/OFF of the p-type MOSFET 14 and n-type MOSFET 15 on the basis of an address signal and the decoder enable signal (decoder control signal) X, thereby setting the word line WL at high level (H level) by supplying the power supply voltage, at low level (L level) by supplying the ground voltage (0 V), or at high impedance (i.e., in a floating state).

Reference numeral 2 denotes a ferroelectric capacitor which forms a memory cell which stores data in accordance with its polarization direction. One terminal of this ferroelectric capacitor 2 is connected to the word line WL, and the other terminal of the ferroelectric capacitor 2 is connected to the bit line BL. A sense amplifier 3 is connected to the bit line BL. This sense amplifier 3 compares a potential read out from the ferroelectric capacitor 2 to the bit line BL with a potential read out to a bit line /BL, and amplifies the difference. Note that the potential read out to the bit line /BL can also be a predetermined reference potential.

A write amplifier 4 is connected to the bit line BL. This write amplifier 4 controls the voltage of the bit line BL in order to write data in the ferroelectric capacitor 2. The sense amplifier 3 and write amplifier 4 are connected together to a data line DQ. Accordingly, the sense amplifier 3 outputs readout data from the ferroelectric capacitor 2 to the data line DQ which is one bit of an I/O data bus. Also, the write amplifier 4 controls the voltage (low level or high level) of the bit line BL in accordance with data (0 or 1) obtained from the data line DQ, in order to write the data in the ferroelectric capacitor 2.

Reference numeral 5 denotes a decoder enable logic circuit (decoder control unit) which supplies the decoder enable signal X for controlling driving of the word lines WL to a plurality of decoder circuits 1 arranged on one bit line BL. To perform the above operation, the two input terminals of this decoder enable logic circuit 5 are connected to a clock line for supplying a CEB signal as a clock signal, and to the data line DQ for transmitting readout data and write data. The output terminal of the decoder enable logic circuit 5 is connected to the signal line of the decoder enable signal X. A circuit example of the decoder enable logic circuit 5 will be explained below with reference to the accompanying drawing.

Figure 2A:
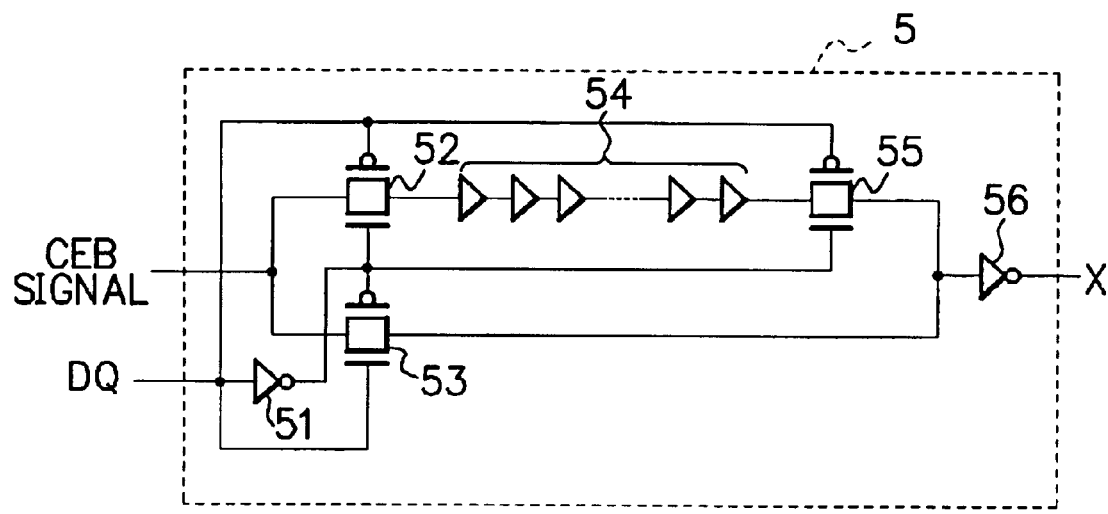
FIGS. 2A and 2B are views showing a circuit example of a decoder enable logic circuit 5 shown in FIG. 1 and the operation of the circuit.

FIG. 2A is a view showing a circuit example of the decoder enable logic circuit 5 shown in FIG. 1. As shown in FIG. 2A, this decoder enable logic circuit 5 includes an inverter 51, transfer gates 52, 53, and 55, and delay elements 54. These delay elements 54 are a plurality of series-connected buffers. The larger the number of these buffers, the longer the delay time.

As shown in FIG. 2A, that input terminal of the decoder enable logic circuit 5, which is connected to the data line DQ is connected to p-channel gate terminals of the transfer gates 52 and 55, each of which has a p-channel gate terminal and an n-channel gate terminal, and to an n-channel gate terminal of the transfer gate 53. This input terminal connected to the signal line DQ is also connected to the n-channel gate terminals of the transfer gates 52 and 55 and the p-channel gate terminal of the transfer gate 53 via the inverter 51. Also, that input terminal of the decoder enable logic circuit 5, which is connected to the signal line of the CEB signal is connected to the input terminals of the transfer gates 52 and 53. The output terminal of the transfer gate 52 is connected to the input terminal of the transfer gate 55 via the delay elements 54. The output terminals of the transfer gates 53 and 55 are connected to the output terminal of the decoder enable logic circuit 5 via an inverter 56 to output the decoder enable signal X.

Figure 2B:
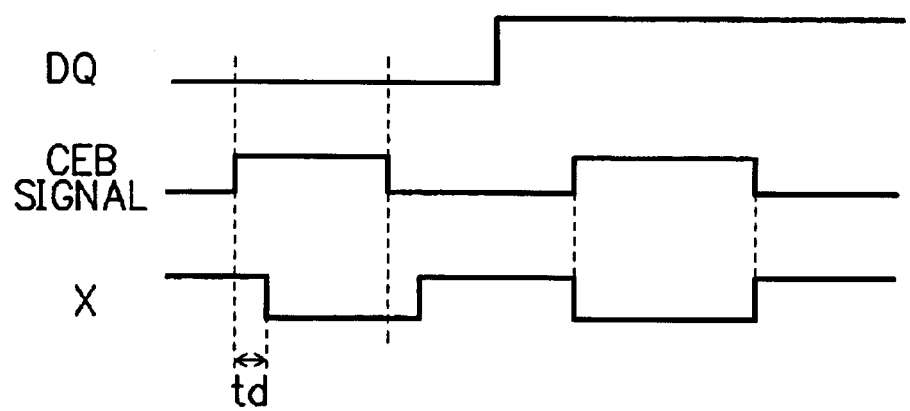
Figure 4:
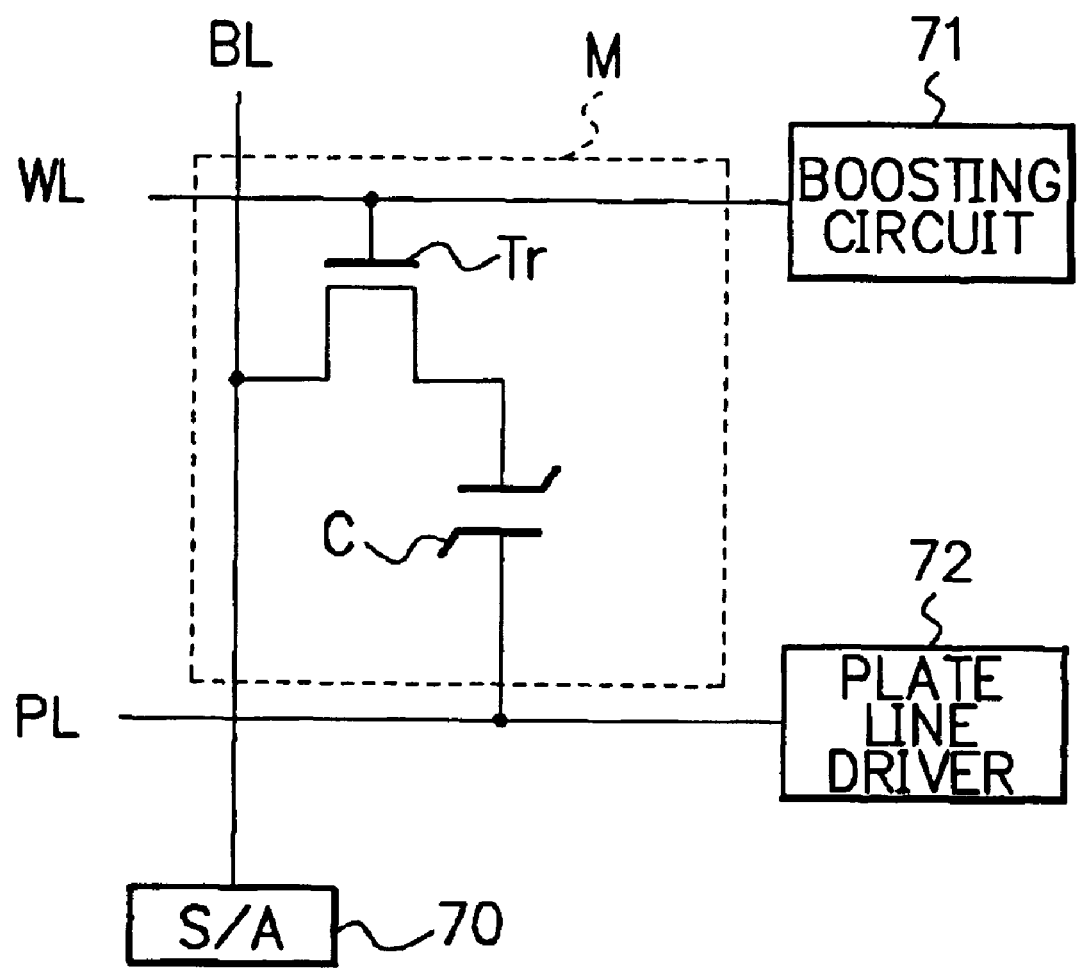
FIG. 4 is a block diagram showing an outline of the arrangement of a conventional 1T1C memory cell including a ferroelectric capacitor.

The operation of the decoder enable logic circuit 5 shown in FIG. 2A will be described below. FIG. 2B is a view for explaining the operation of this decoder enable logic circuit 5 shown in FIG. 2A. As shown in FIG. 2B, while the data line DQ is at low level, the transfer gates 52 and 55 are ON, and the transfer gate 53 is OFF. Accordingly, the decoder enable logic circuit 5 delays the input CEB signal for a time Td by the delay elements 54, inverts the delayed signal by the inverter 56, and outputs the inverted signal as the decoder enable signal X. The delay time Td is longer than a time during which an address decoding circuit 6 changes the address decoded signal on the basis of the trailing edge of the CEB signal.

While the data line DQ is at high level, the transfer gates 52 and 55 are OFF, and the transfer gate 53 is ON. Accordingly, the decoder enable logic circuit 5 outputs the decoder enable signal X which is an inverted signal which hardly lags behind a change in the CEB signal and is synchronized with the CEB signal. That is, the decoder enable signal X output from the decoder enable logic circuit 5 changes in synchronism with a change in the CEB signal when the data line DQ is at high level, and changes after the address decoded signal changes with a change in the CEB signal when the data line DQ is at low level.

The address decoding circuit 6 outputs the address decoded signals (A1, /A1, A2, and /A2) on the basis of an address latched at the trailing edge of the CEB signal. Note that the number of types of address decoded signals output from this address decoding circuit 6 is not limited to the four types, i.e., A1, /A1, A2, and /A2. That is, a predetermined number of types are output in accordance with the number of memory cells and the number of bits of an address. A precharge circuit 7 precharges the bit lines BL and /BL to 0 V (low level).

The operation of the ferroelectric semiconductor device including the memory cell peripheral circuits described above will be explained below.

FIG. 3 is a timing chart showing the operation of this ferroelectric semiconductor device including the memory cell peripheral circuits shown in FIG. 1. First, the signals shown in FIG. 3 will be explained. A CEB signal is a clock signal and periodically repeats high level and low level. An address is a signal having a plurality of bits to be input to the address decoding circuit 6. At the trailing edge of the CEB signal, this address signal changes to a value (Valid shown in FIG. 3) which designates an arbitrary memory cell, and is loaded into the address decoding circuit 6. A write signal falls for a predetermined period to control the ferroelectric semiconductor device so as to write data in a memory cell (the ferroelectric capacitor 2).

Address decoded signals (A1, A2) are output by the address decoding circuit 6 shown in FIG. 1 by decoding an address loaded when the CEB signal falls. Although these address decoded signals (A1, A2) are 2-bit data, they change in the same way, so only one signal is shown in FIG. 3 for simplicity. A decoder enable signal X is output by the decoder enable logic circuit 5 shown in FIG. 1. WL0 is a signal of the word line WL0 shown in FIG. 1. BL is a signal of the bit line BL shown in FIG. 1. WL1 and WL2 are signals of the word lines WL1 and WL2, respectively. As described above, FIG. 3 shows signals pertaining to the decoder circuit 1 and memory cell (ferroelectric capacitor 2) connected to the word line WL0.

Operations (0 data read, 1 data write, and 0 data write) of the memory cell peripheral circuits shown in FIG. 1 will be described next in accordance with signal changes shown in FIG. 3.

The states of the decoder circuit 1 and word line WL0 at time t0 will be explained first. At time t0, both the address decoded signals (A1, A2) are at low level, so the output from the NAND gate 10 is at high level. Also, the decoder enable signal X is at low level, and the output from the ExOR gate 11 is at high level. Accordingly, the output from the ExNOR gate 12 changes to high level, and the output from the NOR gate changes to low level. As a consequence, the p-type MOSFET 14 and n-type MOSFET 15 are turned off. This changes the word line WL to high impedance.

The operation of 0 data read (t1 to t4) will be explained below.

When the CEB signal falls at time t1, the address decoding circuit 6 latches and decodes an address to raise the address decoded signals A1 and A2. Accordingly, the output signal from the NAND gate 10 falls, the output signal from the ExOR gate 11 falls to low level, and the output signal from the ExNOR gate 12 holds high level. Also, the output signal from the NOR gate 13 rises to high level. Consequently, the n-type MOSFET 15 is turned on while the p-type MOSFET 14 is kept off, so the word line WL0 is grounded to 0 V. Furthermore, the bit line BL is at low level because it is precharged to 0 V by the precharge circuit 7, and the data line DQ is also at low level.

At time t2, the data line DQ connected to the data enable logic circuit 5 is at low level, so the decoder enable signal X rises as it is delayed for the time Td from the CEB signal. Accordingly, the output signal from the ExOR gate 11 rises to high level, and the output signal from the ExNOR gate 12 falls to low level. Also, the NOR gate 13 falls to low level. Since this turns on the p-type MOSFET 14 and turns off the n-type MOSFET 15, the word line WL0 is connected to the power supply voltage line and set at the same potential (high level) as the power supply voltage. Consequently, the potential of the bit line BL changes in accordance with data ("0" in FIG. 3) stored in the memory cell (ferroelectric capacitor 2).

At time ta, the sense amplifier 3 compares the potential of the bit line BL with the potential of the bit line /BL and amplifies the difference. Accordingly, the bit line BL changes to 0 V (low level; the solid line in FIG. 3), and the bit line /BL changes to high level (the dotted line in FIG. 3). As a consequence, 0 data is read out from the memory cell (ferroelectric capacitor 2) via the bit line BL.

At time t3, the CEB signal rises. Also, the address decoding circuit 6 sets all the address decoded signals at low level. Therefore, the address decoded signals A1 and A2 fall to low level. This causes the output signal from the NAND gate 10 to rise and the output signal from the ExOR gate 11 to fall to low level. As a consequence, the output signal from the ExNOR gate 12 holds low level. In addition, the output signal from the NOR gate 13 holds low level. Accordingly, the p-type MOSFET 14 is kept on, the n-type MOSFET 15 is kept off, so the word line WL0 holds high level.

At time t4, since the data line DQ is at low level, the decoder enable signal X falls as it is delayed for the time Td from the CEB signal. Accordingly, the output signal from the ExOR gate 11 rises to high level, and the output signal from the ExNOR gate 12 also rises to high level. Since the NOR gate 13 is at low level, the p-type MOSFET 14 and n-type MOSFET 15 are turned off, so the word line WL0 changes to high impedance. In this manner, the operation of reading out 0 data from the memory cell (ferroelectric capacitor 2) is complete.

At time tb, the sense amplifier 3 is turned off to precharge the potentials of the bit lines BL and /BL to 0 V (the precharge circuit 7 is turned on). Also, the write signal for performing control such that a data write process is performed between time t4 and time t5 falls. Consequently, the data write process starts.

The operation of writing "1" data in the memory cell will be explained below.

First, when the CEB signal falls at time t5, the address decoding circuit 6 latches and decodes an address to raise the address decoded signals A1 and A2. Accordingly, the output signal from the NAND gate 10 falls to low level, the output signal from the ExOR gate 11 falls to low level, and the output signal from the ExNOR gate 12 holds high level. Also, the output signal from the NOR gate 13 rises to high level. Consequently, the n-type MOSFET 15 is turned on while the p-type MOSFET 14 is kept off, so the word line WL0 is grounded to 0 V from the high impedance state.

At time t6, the data line DQ is at low level, so the decoder enable signal X rises to high level as it is delayed for the time Td from the CEB signal. Accordingly, the output signal from the ExOR gate 11 rises to high level, and the output signal from the ExNOR gate 12 falls to low level. Also, the NOR gate 13 falls to low level. Since, therefore, the p-type MOSFET 14 is turned on and the n-type MOSFET 15 is turned off, the word line WL0 is connected to the power supply voltage line and set at the same potential (high level) as the power supply voltage. Consequently, the potentials of the bit lines BL and /BL change in accordance with data ("1" in FIG. 3) stored in the memory cell (ferroelectric capacitor 2).

At time tc, the write amplifier 4 raises the potential of the bit line BL to high level on the basis of "1" data (high level) on the data line DQ. Also, the write amplifier 4 lowers the potential of the bit line /BL to 0 V. As a consequence, the bit line BL changes to high level (the solid line in FIG. 3), and the bit line /BL changes to low level (0 V; the dotted line in FIG. 3).

When the CEB signal rises at time t7, the decoder enable signal X falls to low level at substantially the same time the CEB signal rises, because the data line DQ is at high level. Accordingly, the output signal from the ExOR gate 11 falls to low level, and the output signal from the ExNOR gate 12 rises to high level. Also, the NOR gate 13 rises to high level. Since, therefore, the p-MOSFET 14 is turned off and the n-type MOSFET 15 is turned on, the word line WL0 is grounded to 0 V (low level). Consequently, a high-level voltage and 0 V are applied to the memory cell (ferroelectric capacitor 2) from the bit line BL and word line WL0, respectively, and "1" data is written.

At time t8, the address decoding circuit 6 sets all the address decoded signals at low level. Therefore, the address decoded signals A1 and A2 also fall to low level. This causes the output signal from the NAND gate 10 to rise to high level and the output signal from the ExOR gate 11 to fall to low level. Therefore, the output signal from the ExNOR gate 12 holds high level. In addition, the output signal from the NOR gate 13 falls to low level. Since, therefore, the p-type MOSFET 14 and n-type MOSFET 15 are kept off, the word line WL0 changes to high impedance. In this way, the process of writing "1" data in the memory cell (ferroelectric capacitor 2) is complete.

At time td, the write amplifier 4 is turned off, and the potential of the bit line BL drops. Then the precharge circuit 7 lowers the potentials of the bit lines BL and /BL to 0 V. In addition, the write signal falls between time t8 and time t9.

The operation of writing "0" data in the memory cell will be described below.

First, when the CEB signal falls at time t9, the address decoding circuit 6 latches and decodes an address to raise the address decoded signals A1 and A2. Accordingly, the output signal from the NAND gate 10 falls to low level, the output signal from the ExOR gate 11 falls to low level, so the output signal from the ExNOR gate 12 holds high level. Also, the output signal from the NOR gate 13 rises to high level. Consequently, the n-type MOSFET 15 is turned on while the p-type MOSFET 14 is kept off, so the word line WL0 is grounded to 0 V (low level) from the high impedance state.

At time t10, the data line DQ is at low level, so the decoder enable signal X rises to high level as it is delayed for the time Td from the CEB signal. Accordingly, the output signal from the ExOR gate 11 rises to high level, and the output signal from the ExNOR gate 12 falls to low level. Also, the NOR gate 13 falls to low level. Since, therefore, the p-type MOSFET 14 is turned on and the n-type MOSFET 15 is turned off, the word line WL0 is connected to the power supply voltage line and set at the same potential (high level) as the power supply voltage. Consequently, the potentials of the bit lines BL and /BL change in accordance with data ("0" in FIG. 3) stored in the memory cell (ferroelectric capacitor 2).

At time te, the write amplifier 4 lowers the potential of the bit line BL to low level on the basis of "0" data (low level) on the data line DQ. Also, the write amplifier 4 raises the potential of the bit line /BL to high level. As a consequence, the bit line BL changes to low level (the solid line in FIG. 3), and the bit line /BL changes to high level (the dotted line in FIG. 3).

At time t11, the CEB signal rises. In addition, the address decoding circuit 6 sets all the address decoded signals at low level. Therefore, the address decoded signals A1 and A2 also fall to low level. This causes the output signal from the NAND gate 10 to rise and the output signal from the ExOR gate 11 to fall to low level. As a consequence, the output signal from the ExNOR gate 12 holds low level. Also, the output signal from the NOR gate 13 holds low level. Accordingly, the p-type MOSFET 14 is kept on, the n-type MOSFET 15 is kept off, so the word line WL0 holds high level. Between time t10 and time t11 described above, low level and high level are supplied to the memory cell from the bit line BL and word line WL0, respectively, and "0" data is written.

At time t12, since the data line DQ is at low level, the decoder enable signal X falls as it is delayed for the time Td from the CEB signal. Accordingly, the output signal from the ExOR gate 11 rises to high level, and the output signal from the ExNOR gate 12 also rises to high level. The NOR gate 13 is kept at low level. Therefore, the p-type MOSFET 14 and n-type MOSFET 15 are turned off, and the word line WL0 changes to high impedance. In this manner, the operation of writing "0" data from the memory cell (ferroelectric capacitor 2) is complete.

During the operations described above, nonselected word lines WL1, WL2, . . . , not selected by the decoder circuits 1 are at high impedance. That is, these nonselected word lines WL float. Therefore, even when the voltage of a bit line BL connected to a nonselected memory cell changes, it is possible to prevent data held in this memory cell from being changed under the influence of this voltage change.

In the ferroelectric memory according to this embodiment as described above, no transistor is interposed between a bit line and memory cell (ferroelectric capacitor). Therefore, it is possible to write data in and read out data from the memory cell without boosting a word line. Also, the ferroelectric memory according to this embodiment does not use any plate line driver which is required in the conventional ferroelectric memory to apply a voltage to a plate line. This realizes a semiconductor memory having a simple circuit configuration.

The embodiment of the present invention has been explained above with reference to the accompanying drawings. However, a practical arrangement is not restricted to this embodiment and includes design and the like within the scope of the invention.

As has been described above, the semiconductor memory and the method of controlling the same according to the present invention comprise a plurality of memory cells each including one ferroelectric capacitor having one terminal connected to a bit line and the other terminal connected to a word line, and a plurality of decoders arranged on each of the plurality of memory cells to control the word line connected to the memory cell. Therefore, the plurality of decoders can control the word line to one of high level, low level, and a floating state. Hence, a bit line and memory cell (ferroelectric capacitor) are directly connected by eliminating a transistor which is conventionally formed between the bit line and memory cell. This obviates the need to form any boosting circuit for boosting a word line when data is to be written in a memory cell. Furthermore, a word line is connected to that terminal of a memory cell, which is conventionally connected to a plate line, and address selection and voltage application are performed from this word line. Consequently, a simple circuit configuration can be obtained by omitting a plate line driver for applying a voltage to a plate line.

What is claimed is:

1. A semiconductor memory comprising:

a plurality of memory cells each including one ferroelectric capacitor having one terminal connected to a bit line and the other terminal connected to a word line; and a plurality of decoders arranged corresponding to each of said plurality of memory cells to control said word line connected to said memory cells by driving the word lines when selected and by floating the word lines when the corresponding memory cell is not selected on the basis of an address signal or a decoded address signal obtained by decoding the address signal, wherein said plurality of decoders control whether or not to keep the signal level of the selected word line for a predetermined period according to the signal level of said bit line, after said address signal or said decoded address signal changes.

2. The memory according to claim 1, further comprising a decoder control unit which is connected to said plurality of decoders arranged corresponding to one bit line, and outputs a decoder control signal for controlling driving of the word lines by said plurality of decoders.

3. The memory according to claim 1, wherein said plurality of decoders control said word lines to one of low level, high level, and a floating state.

4. The memory according to claim 1, wherein said plurality of decoders comprise p- and n-type MOSFETs, and the drain terminals of said p- and n-type MOSFETs are interconnected, said word line is connected to the interconnecting point, the source terminal of said p-type MOSFET is connected to a power supply voltage, and the source terminal of said n-type MOSFET is grounded.

5. The memory according to claim 1, further comprising an address decoding unit for decoding the address signal to output the address decoded signal, wherein said decoding unit performs the selection or non-selection control on the basis of the address decoded signal decoded by said address decoding unit.

6. The memory according to claim 1, further comprising a write amplifier connected to said bit line to drive said bit line when data is to be written, wherein when 1 data is to be written in said memory cell, said write amplifier sets said bit line at high level, and the corresponding decoder drives said word line to low level, and when 0 data is to be written in said memory cell, said write amplifier sets said bit line at low level, and the corresponding decoder drives said word line to high level.

7. The memory according to claim 1, further comprising sense amplifiers connected to said bit lines to amplify data read out to said bit lines when the data is read out, wherein when data is to be read out from said memory cell, the corresponding decoder drives said word line to high level, and said sense amplifier amplifies the data read out from said memory cell to said bit line in response to the corresponding word line being driven to high level.

8. A method of controlling a semiconductor memory comprising a plurality of memory cells each including one ferroelectric capacitor having one terminal connected to a bit line and the other terminal connected to a word line, and a plurality of decoders arranged corresponding to each of the plurality of memory cells and connected to the memory cells via the word lines, wherein the plurality of decoders are so controlled as to drive the word lines when the corresponding memory cell is selected on the basis of an address signal or a decoded address signal obtained by decoding the address signal, wherein the plurality of decoders are so controlled as to float the word lines when the corresponding memory cell is not selected on the basis of the address signal or the decoded address signal obtained by decoding the address signal, and wherein said plurality of decoders control whether or not to keep the signal level of the selected word line for a predetermined period according to the signal level of said bit line, after said address signal or said decoded address signal changes.

9. The method according to claim 8, wherein the semiconductor memory comprises write amplifiers connected to the bit lines to drive the bit lines when data is to be written, when 1 data is to be written in the memory cell, the write amplifier is so controlled as to set the bit line at high level, and the corresponding decoder is so controlled as to set the word line at low level, and when 0 data is to be written in the memory cell, the write amplifier is so controlled as to set the bit line at low level, and the corresponding decoder is so controlled as to set the word line at high level.

10. The method according to claim 8, wherein the semiconductor memory further comprises sense amplifiers connected to the bit lines to amplify data read out to the bit lines when the data is read out, and the method comprises:

a first step of so controlling the corresponding decoder as to set the word line at high level, when data is to be read out from the memory cell; and a second step of so controlling the sense amplifier as to amplify the data read out from the memory cell to the bit lines in the first step.

* * * * *